United States Patent
Kuivalainen et al.

(10) Patent No.: US 10,206,315 B2
(45) Date of Patent: Feb. 12, 2019

(54) MAGNETIC SHIELDING APPARATUS

(75) Inventors: Jani Samuli Kuivalainen, Riihikoski (FI); Thomas Benedict Slotte, Turku (FI)

(73) Assignee: Nokia Technologies Oy, Espoo (FI)

( * ) Notice: Subject to any disclaimer, the term of this patent is extended or adjusted under 35 U.S.C. 154(b) by 201 days.

(21) Appl. No.: 13/883,668

(22) PCT Filed: Nov. 12, 2010

(86) PCT No.: PCT/IB2010/055144
§ 371 (c)(1),
(2), (4) Date: Jun. 24, 2013

(87) PCT Pub. No.: WO2012/063105
PCT Pub. Date: May 18, 2012

(65) Prior Publication Data
US 2014/0056448 A1     Feb. 27, 2014

(51) Int. Cl.
*H04R 25/00* (2006.01)
*H05K 9/00* (2006.01)
*H04R 1/02* (2006.01)

(52) U.S. Cl.
CPC ............ *H05K 9/00* (2013.01); *H04R 1/02* (2013.01); *H04R 1/023* (2013.01); *H04R 2209/022* (2013.01)

(58) Field of Classification Search
CPC .......... H04R 25/658; H04R 2225/49; H04R 25/608; H04R 25/65; H04R 25/604; H04R 2209/022; Y10T 29/49005; H05K 9/00

USPC ........................................ 381/189
See application file for complete search history.

(56) References Cited

U.S. PATENT DOCUMENTS 2,256,689 A    9/1941   Quam
5,909,015 A    6/1999   Yamamoto et al.

FOREIGN PATENT DOCUMENTS

| CN | 201213307 | 3/2009 |
| CN | 201213307 Y | 3/2009 |
| EP | 1065911 | 1/2001 |
| WO | 2008061549 A1 | 5/2008 |

OTHER PUBLICATIONS

Kleiner, Mendel. (2012). Acoustics and Audio Technology (3rd Edition). (pp. 317-319). J. Ross Publishing, Inc. Online version available at: http://app.knovel.com/hotlink/toc/id:kpAATE0001/acoustics-audio-technology/acoustics-audio-technology.*
Hughes, Austin Drury, Bill. (2013). Electric Motors and Drives—Fundamentals, Types and Applications (4th Edition). (pp. 1-23). Elsevier. Online version available at: http://app.knovel.com/hotlink/toc/id:kpEMDFTA01/electric-motors-drives/electric-motors-drives.*

(Continued)

*Primary Examiner* — Phylesha Dabney
(74) *Attorney, Agent, or Firm* — Harrington & Smith (57) ABSTRACT

An apparatus comprising: at least one magnetic shielding plate located between a transducer and an exterior of the apparatus with at least one conduit configured to permit sound to pass through the cover, wherein the at least one magnetic shielding plate is configured to form a trap for particles.

19 Claims, 5 Drawing Sheets

(56) References Cited

OTHER PUBLICATIONS

ASM International Handbook Committee. (1989). ASM Handbook, vol. 17—Nondestructive Evaluation and Quality Control. (pp. 89-90). ASM International. Online version available at: http://app.knovel.com/hotlink/toc/id:kpASMHVNE1/asm-handbook-volume-17/asm-handbook-volume-17.*

AWS Committee on Methods of Inspection. (2000). Welding Inspection Handbook (3rd Edition). (pp. 172-175). American Welding Society (AWS). Online version available at: http://app.knovel.com/hotlink/toc/id:kpWIHE0006/welding-inspection-handbook/welding-inspection-handbook.*

Kleiner, Mendel. (2012). Acoustics and Audio Technology (3rd Edition), (pp. 317-319). J. Ross Publishing, Inc. Online version available at: http://app.knovel.eom/hotlink/toc/id:kpAATEOOO1/acoustics-audio-technology/acoustics-audio-technology.*

Hughes, Austin Drury, Bill. (2013). Electric Motors and Drives—Fundamentals, Types and Applications (4th Edition), (pp. 1-23). Elsevier. Online version available at: http://app.knovel.eom/hotlink/toc/id:kpEMDFTAO1/electric-motors-drives/electric-motors-drives.*

ASM International Handbook Committee. (1989). ASM Handbook, vol. 17—Nondestructive Evaluation and Quality Control, (pp. 89-90). ASM International. Online version available at: http://app.knovel.com/hotlink/toc/id:kpASMHVNEI/asm-handbook-volume-17/asm-handbook-volume-17.*

AWS Committee on Methods of Inspection. (2000). Welding Inspection Handbook (3rd Edition), (pp. 172-175). American Welding Society (AWS). Online version available at: http://app.knovel.eom/hotlink/toe/id:kpWIHE0006/welding-inspection-handbook/welding-inspection-handbook.*

International Search Report and Written Opinion received for corresponding Patent Cooperation Treaty Application No. PCT/IB2010/055144, dated Jul. 20, 2011, 12 pages.

Extended Eurpoean Search Report received for corresponding European Application No. 10859417.7-1910, dated Mar. 24, 2014, 6 pages.

Office action received for corresponding Chinese Patent Application No. 201080071082.9, dated Feb. 28, 2015, 8 pages of office action and no English translation available.

* cited by examiner

MAGNETIC SHIELDING APPARATUS

RELATED APPLICATION

This application was originally filed as Patent Cooperation Treaty Application No. PCT/IB2010/055144 filed Nov. 12, 2010.

FIELD OF THE APPLICATION

The present application relates to a method and apparatus for magnetic shielding. In some embodiments the method and apparatus relate to a magnetic shielding for transducers.

BACKGROUND OF THE APPLICATION

Some portable electronic devices comprise transducers such as loudspeakers and/or earpieces which are required to be small in size. Transducers are important components in electronic devices such as mobile phones for the purposes of playing back music or having a telephone conversation. The quality and loudness of a transducer in an electronic device are important especially if a user listens to sounds generated by an electronic device at a distance from the electronic device.

Furthermore in portable devices dust and water protection is important specifically with regards to the transducers. However dust and other small particles (and water) can often reach the transducer components and cause component damage. In particular the dynamic moving coil components in transducers radiate in each direction as the diaphragm moves forwards and backwards and as the construction of the transducer typically has open outlets on either side of the transducer which are free to air, the permanent magnet of a moving coil transducers can attract magnetic particles which migrate through the portable device and reach the coil and diaphragm. These particles can damage the sensitive components and/or reduce the performance of these components when the apparatus is in operation.

For example after some time the force between the magnetic dust on the diaphragm and the permanent magnet inside the electrodynamic loudspeaker can pull the diaphragm towards the magnet and make the sound quieter, cause distortion or both. These types of failure typically requires repair and is costly to the manufacturer of the device if the failure occurs within the warranty period or can causes brand damage if the failure occurs soon after the warrantee period as the user considers the device to have failed prematurely and of poor quality.

Often a protective mesh or other porous material, where appropriate, is implemented to assist audio reproduction quality but maintain good reliability of the transducer by protecting the transducer from particles entering through the sound outlets in the device. For example a dust net can be placed in front of the loudspeaker. However the more effective a dust net is, in other words the denser the material used, the more attenuation to the sound generated by the speaker and therefore the muffling of the speaker output occurs. In some situations a complicated mechanical channel structure can be used to improve dust protection by making the route longer from the outer surface of the phone to the loudspeaker diaphragm. However longer channel structures require additional volume within the device and furthermore require the height or depth of the phone to be increased in order to employ the additional channel length. These increased dimensions are counter to the current design trend to make the phone as thin as possible in order to create a device which is as portable as possible. It has also been proposed that a permanent magnet can be used to collect the magnetic dust. However the employment of further permanent magnets not only increases the cost and that the number of parts required for the device but furthermore can increase stray magnetic fields which are detrimental to the use of the device as they can accidentally erase other magnetic items such as the magnetic strip on a credit card, debit card, a train ticket, or other device using a magnetic strip. The use of a magnetic shields have also been proposed (such as using a perforated μ-metal grate that lets sound pass through) which can be placed in front of the loudspeaker and used to weaken the stray magnetic field and effectively alter the direction of the attractive force. However these typically poorly perform.

SUMMARY OF SOME EMBODIMENTS

Embodiments of the present invention aim to address one or more of the above problems.

In a first aspect of the invention there is an apparatus comprising: at least one magnetic shielding plate located between a transducer and an exterior of the apparatus, wherein the at least one magnetic shielding plate is configured to form a trap for particles.

The magnetic shielding plate may be configured to form part of the apparatus cover.

The at least one magnetic shielding plate may be located between the transducer and an apparatus cover of the apparatus with at least one conduit configured to permit sound to pass through the cover.

A dust trap may be located at at least one conduit configured to permit sound to pass through the cover.

The at least one magnetic shielding plate may comprise at least one of: a mu-metal plate; a material with high magnetic permeability; stainless steel grade SUS 310; and stainless steel grade SUS 430.

The at least one magnetic shielding plate may comprise: a first plate comprising at least one conduit configured to permit sound to pass through the shielding plate.

The at least one magnetic shielding plate may further comprise: at least one second plate, wherein the at least one second plate is located in close proximity to the first plate to form at least one air gap between the first plate and the at least one second plate configured to form the trap for particles.

The first plate may further comprise at least one air gap configured to form the trap for particles.

The air gap may be at least partially co-incident with at least one of the at least one conduits configured to permit sound to pass through the shielding plate.

The transducer may be configured to generate a region of locally stronger magnetic field, wherein at least one of the at least one air gap may be configured to be located in the region of locally stronger magnetic field generated by the transducer.

The at least one air gap may be coated by a material whose relative permeability is lower than the magnetic shielding plate.

The transducer may be configured to generate a region of locally weaker magnetic field, wherein the at least one conduit configured to permit sound to pass through the shielding plate may be configured to be located in the region of locally weaker magnetic field generated by the transducer.

According to a second aspect there is provided a method comprising: locating at least one magnetic shielding plate between a transducer and an exterior of an apparatus; and forming a trap for particles in the at least one magnetic shielding plate.

The magnetic shielding plate may be configured to form part of the apparatus cover.

Locating the at least one magnetic shielding plate may further comprise locating the magnetic shielding plate between the transducer and an apparatus cover of the apparatus with at least one conduit configured to permit sound to pass through the cover.

The method may further comprise locating a dust trap at at least one conduit configured to permit sound to pass through the cover.

The at least one magnetic shielding plate may comprise at least one of: a mu-metal plate; a material with high magnetic permeability; stainless steel grade SUS 310; and stainless steel grade SUS 430.

The method may further comprise forming at least one conduit in a first plate configured to permit sound to pass through the shielding plate.

Forming a trap for particles in the at least one magnetic shielding plate may further comprise: locating at least one second plate in close proximity to the first plate to form at least one air gap between the first plate and each second plate, wherein the air gap may be configured to form the trap for particles.

Forming a trap for particles in the at least one magnetic shielding plate may further comprise forming in the first plate at least one air gap configured to form the trap for particles.

The at least one air gap may be at least partially co-incident with at least one of the at least one conduits configured to permit sound to pass through the shielding plate.

The method may further comprise: generating by the transducer a region of locally stronger magnetic field; and locating the air gap in the region of locally stronger magnetic field generated by the transducer.

The method may further comprise coating the air gap with a material whose relative permeability is lower than the magnetic shielding plate.

The method may further comprise: generating by the transducer an area of locally weaker magnetic field; and locating the at least one conduit configured to permit sound to pass through the shielding plate in the area of locally weaker magnetic field generated by the transducer.

The method may further comprise locating at least one dust trap at the at least one conduit configured to permit sound to pass through the cover.

According to a third aspect there is provided an apparatus comprising: means for locating at least one magnetic shielding plate between a transducer and an apparatus exterior; and means for forming a trap for particles in the at least one magnetic shielding plate.

The magnetic shielding plate may be configured to form part of the apparatus cover.

The means for locating at least one magnetic shielding plate may further locate the magnetic shielding plate between the transducer and an apparatus cover of the apparatus with at least one conduit configured to permit sound to pass through the cover.

The at least one magnetic shielding plate may comprise at least one of: a mu-metal plate; a material with high magnetic permeability; stainless steel grade SUS 310; and stainless steel grade SUS 430.

The apparatus may further comprise: a first plate means; and conduit means located in the first plate means configured to permit sound to pass through the shielding plate.

The means for forming a trap for particles in the at least one magnetic shielding plate may further comprise: at least one second plate means configured in close proximity to the first plate to form at least one air gap between the first plate and each second plate, wherein the air gap may be configured to form the trap for particles.

The means for forming a trap for particles in the at least one magnetic shielding plate may further comprise at least one air gap means located in the first plate, wherein at least one air gap means form the trap for particles.

The air gap means may be at least partially co-incident with at least one of the at least one conduit means for permitting sound to pass through the shielding plate.

The apparatus may further comprise transducer means for generating a region of locally stronger magnetic field; wherein the at least one air gap means may be located in the region of locally stronger magnetic field generated by the transducer.

The apparatus may further comprise coating means located over the air gap wherein the coating means comprise a material whose relative permeability is lower than the magnetic shielding plate.

The transducer means may further generate an area of locally weaker magnetic field; wherein the at least one conduit means may be located in the area of locally weaker magnetic field generated by the transducer.

The apparatus may further comprise at least one dust trap means located at least one conduit configured to permit sound to pass through the cover.

An electronic device may comprise an apparatus as described above.

A chipset may comprise an apparatus as described above.

BRIEF DESCRIPTION OF DRAWINGS

For a better understanding of the present application and as to how the same may be carried into effect, reference will now be made by way of example to the accompanying drawings in which.

SOME EMBODIMENTS OF THE APPLICATION

The following describes apparatus and methods for magnetically shielding a transducer.

Figure 1:
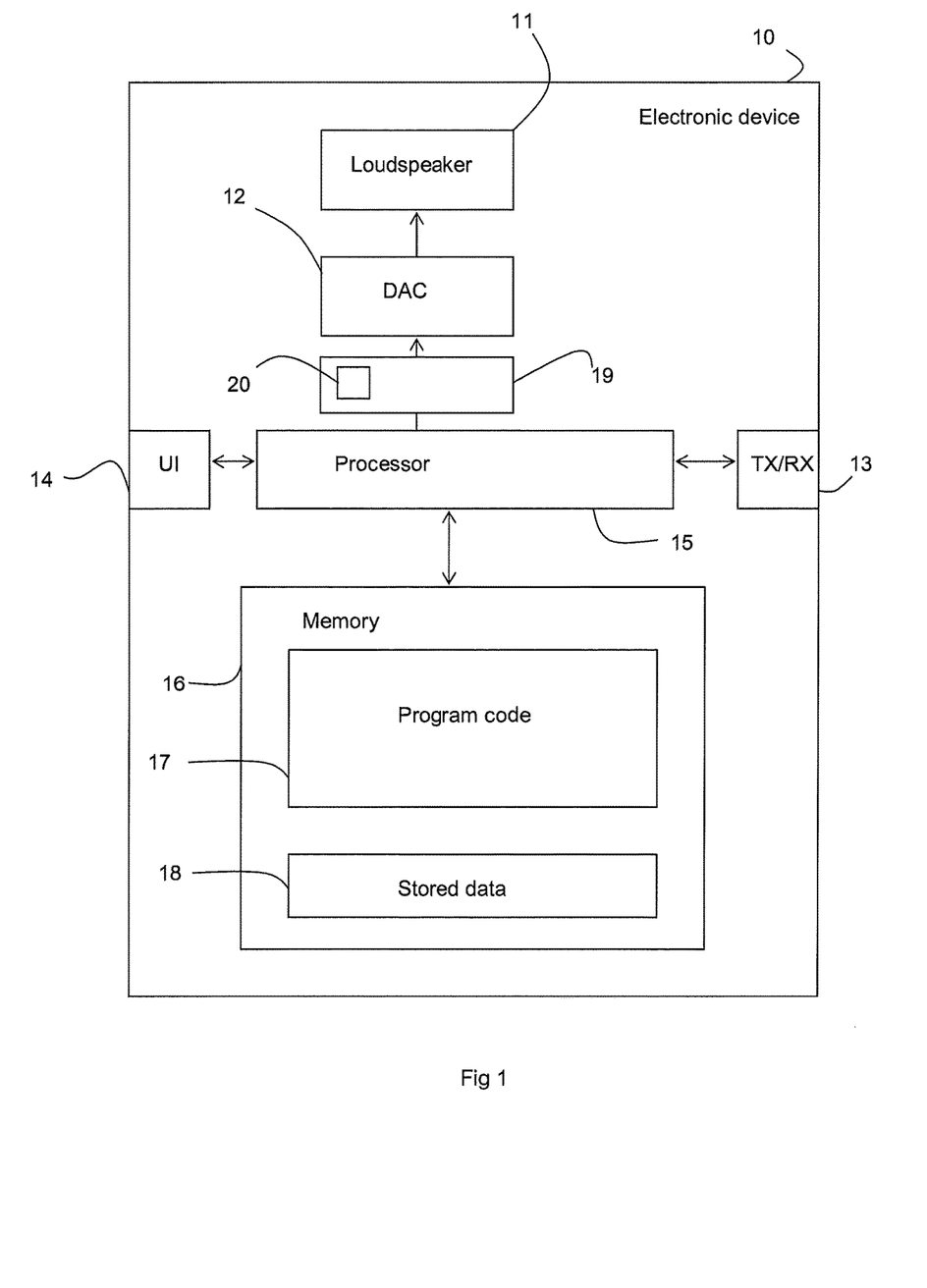
FIG. 1 illustrates a schematic block diagram of an apparatus according to some embodiments.

FIG. 1 discloses a schematic representation of an electronic device or apparatus 10 comprising a transducer 33. The transducer 33 may be an integrated speaker such as an integrated hands free speaker, (IHF), loudspeaker or an earpiece.

The transducer 33 in some embodiments can be any suitable speaker comprising a permanent magnet. In some embodiments where the speaker comprises a dynamic or moving coil, a piezoelectric transducer, an electrostatic transducer or a transducer array comprising microelectromechanical systems (MEMS) the addition of a permanent magnet can be implemented to provide the magnetic field for the dust trap as described herein. Additionally or alternatively the transducer comprises a multifunction device (MFD) component having any of the following; combined earpiece, integrated handsfree speaker, vibration generation means or a combination thereof.

The apparatus 10 in some embodiments can be a mobile phone, portable audio device, or other means for playing sound. The apparatus 10 has a sound outlet for permitting sound waves to pass from the transducer 11 to the exterior environment.

The apparatus 10 is in some embodiments a mobile terminal, mobile phone or user equipment for operation in a wireless communication system.

In other embodiments, the apparatus 10 is any suitable electronic device configured to generate sound, such as for example a digital camera, a portable audio player (mp3 player), a portable video player (mp4 player). In other embodiments the apparatus can be any suitable electronic device with a speaker configured to generate sound. In some other embodiments the apparatus 10 can be any suitable audio or audio subsystem component or any suitable audio capture/audio rendering device In some embodiments, the apparatus 10 comprises a sound generating module 19 which is linked to a processor 15. The processor 15 can be configured to execute various program codes. The implemented program codes may comprise a code for controlling the transducer 11 to generate sound waves. In some embodiments the sound generating module 19 comprises a transducer protection module 20 for modifying the audio signals for the transducer 11.

The implemented program codes in some embodiments 17 can be stored for example in the memory 16 for retrieval by the processor 15 whenever needed. The memory 16 could further provide a section 18 for storing data, for example data that has been processed in accordance with the embodiments. The code can, in some embodiments, be implemented at least partially in hardware or firmware.

In some embodiments the processor 15 is linked via a digital-to-analogue converter (DAC) 12 to the transducer 11. The digital to analogue converter (DAC) 12 can be any suitable converter.

In some embodiments the DAC 12 sends an electronic audio signal output to the transducer 11 and on receiving the audio signal from the DAC 12, the transducer 11 generates acoustic waves. In other embodiments, the apparatus 10 receives control signals for controlling the transducer 11 from another electronic device.

The processor 15 can be further linked to a transceiver (TX/RX) 13, to a user interface (UI) 14 and to a display (not shown). The user interface 14 can enable a user to input commands or data to the apparatus 10. Any suitable input technology can be employed by the apparatus 10. It would be understood for example the apparatus in some embodiments could employ at least one of a keypad, keyboard, mouse, trackball, touch screen, joystick and wireless controller to provide inputs to the apparatus 10.

Figure 2:
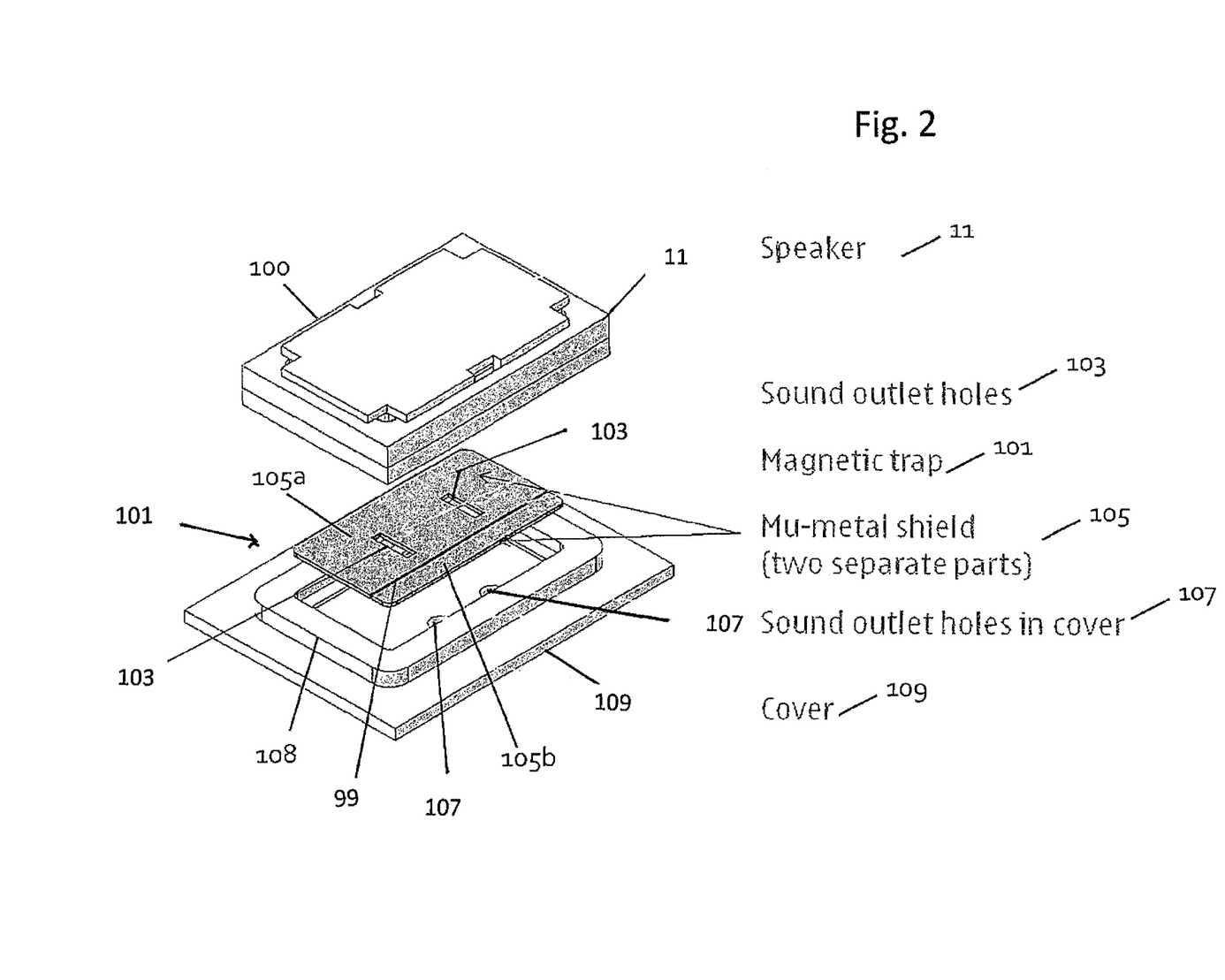
FIG. 2 illustrates a schematic diagram of a first magnetic shield configuration according to some embodiments of the application.

FIG. 2 illustrates a schematic diagram of a first magnetic shield configuration according to some embodiments of the application. This configuration according to some embodiments. This configuration shows a particular example of the general concept of the application wherein the physical construction of the apparatus comprises a transducer and cover separated by at least one plate or laminar made from µ-metal (or another material with similar electromagnetic properties). For example in some embodiments the used materials can be any suitable material with high permeability (in other words low magnetic resistance) forming a magnetic plate. There are numerous types of material with these properties but the µ-metal or (or mu-metal) is the example material used in the examples described herein. Other examples of such materials are SUS 310 and SUS 430. The plate of µ-metal furthermore is configured to have (combined or separate) openings that are shaped to both operate as sound outlets, and also to collect metal dust by means of concentrating the magnetic field to certain regions on the plate (the concentrated magnetic field region can be known as "dust trap"). The concentrated magnetic field areas can be generated using the principle that the magnetic flux density is locally higher in a region where there is a narrow gap and/or a sharp edge/corner in the plate, and locating these regions so that they do not interfere with sound output through the plate. Furthermore as shown herein by placing these features in specific locations or regions the dust trap can generate a locally strong magnetic field, and the force attracting metallic dust to the dust trap in this region is greater than the attractive force of the loudspeaker through the sound outlets. Therefore in such embodiments dust entering from the outside is attracted to the dust trap rather than to the loudspeaker beneath the plate. Although the examples shown herein discuss the application of embodiments where the transducer is a speaker (in other words converting electronic signals into acoustic waves) it would be understood that in some embodiments the transducer is operating in a microphone mode of operation converting acoustic waves into electronic signals.

As shown in FIG. 2, the transducer module or speaker module comprising a transducer 11 is in some embodiments configured to be shaped such that it co-operates with and is located within a pocket region 108 on the inside of the cover 109 which can for example be formed from a moulding as part of the inside of the cover 109. The cover 109 is in some embodiments an integral part of the casing of the device.

The cover 109 can be configured in some embodiments to have at least one sound outlet hole 107 configured to permit the acoustic waves generated by the transducer 11 to pass out of the device (or in the case where the transducer is a microphone the acoustic waves received by the transducer). Although in the examples described herein the sound outlet or sound conduit in the cover 109 is a series of holes any suitable shape or arrangement can be used to allow the sound to pass through the cover 109. Thus in some embodiments the sound outlet holes can be a single hole, or at least one slit. In some embodiments the sound output holes 107 can be covered by an acoustic transparent or opaque cover, such as a wire mesh, to reduce the amount of foreign bodies entering the device.

The apparatus 10 in some embodiments further comprises two separate µ-metal plates 105a, 105b which can furthermore be located within the cover pocket region 108 and can be sandwiched between the inside of the cover 109 and the transducer module 100 and lie adjacent to each other separated by a small air gap 99. The air gap 99 can be formed by the pocket region 108 having suitable moulding forms locating each of the metal plates 105a and 105b, or by a further form locating the two metal plates 105 in such a way to form the air gap 99. In such embodiments the dust trap or magnetic trap 101 can therefore be formed by the two separate µ-metal (or other electromagnetically similar) plates which are located as close to each other as possible without touching forming the narrow gap where the magnetic field is strong. The location of the dust trap can in some embodiments be chosen so that the magnetic field generated by the loudspeaker or transducer 11 is particularly strong in this location. For example in some embodiments the location of the dust trap can be close to the air gap 99 of the loudspeaker. The placement of the air gap 99 of the metal plates near to a region of strong magnetic field generated by the transducer in some embodiments ensures that the magnetic field in the gap that forms the dust trap is strong enough to attract the dust.

At least one of the metal plates 105 furthermore comprises a sound outlet holes 103 configured to permit the transmission of acoustic waves through the thickness of the metal plates 105. In some embodiments the sound outlet holes 103 are located significantly distant from the air gap to ensure that the audio performance of the apparatus is constant even if the dust trap 101 gets completely blocked by metal dust. Thus for example the sound outlet holes 103 for the metal plates 105 can be located at a position closer to the middle of the loudspeaker's magnet, where the magnetic field is weaker. Although in these examples the sound outlet is described as being holes it would be understood that any suitable configuration of shapes can be implemented provided that they provide a suitable acoustically transparent or opaque medium. In some embodiments by shaping and orienting the metal plate sound outlets holes 103 optimally in relation to the magnetic field generated by the loudspeaker, the field around the metal sound outlets holes 103 can be kept weak and ensure that the sound outlet holes stay clean. Where the dust trap is an open gap, there is a risk that some dust can be sucked in by air flowing to and from the loudspeaker or transducer 11 when it operates. Therefore in some embodiments the small gap forming the dust trap can be coated e.g. by a thin layer of tape, or more generally coated/filled with any material whose relative permeability is very low (close to 1) to reduce this possibility of dust being sucked in by air flowing to and from the transducer 11.

Although the example shown in FIG. 2 and described herein shows one dust trap of magnetic trap 101 it would be understood that in some embodiments more than one magnetic trap over the speaker or transducer can be implemented. For example a further gap can be implemented in some embodiments by the metal plate layer being implemented as three plates, which have two small air gaps at the interfacing of the three plates.

Furthermore in the above example the structure of the air gap is linear, however it would be appreciated that in some embodiments the air gap structure can be any suitable configuration such as a linear array, or a rectangle or an oval or a circle. Furthermore, the air gap may follow the outline of the air gap inside the speaker.

Figure 3:
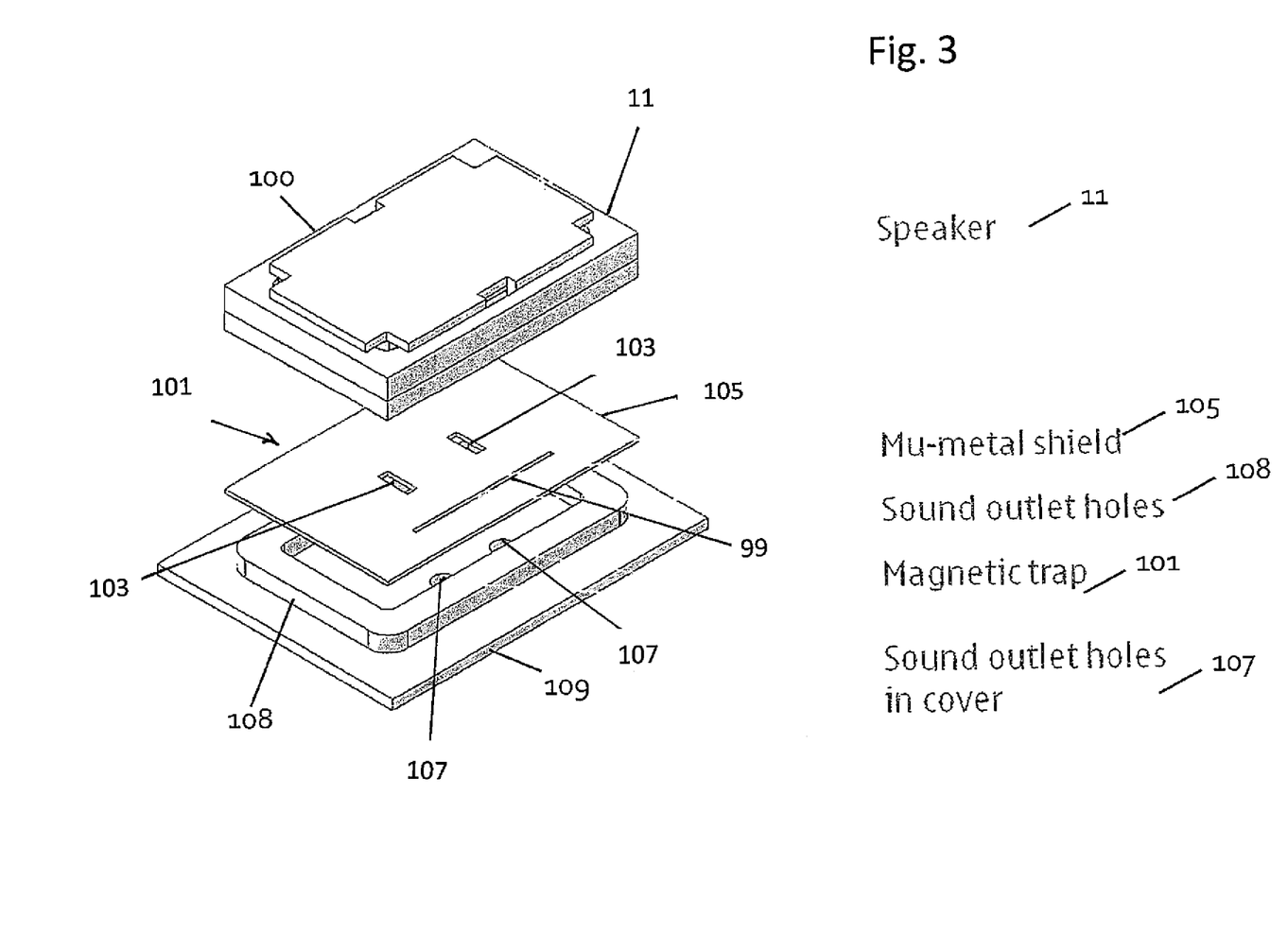
FIG. 3 illustrates a schematic diagram of a second magnetic shield configuration according to some embodiments of the application.

With respect to FIG. 3 a further example of a suitable magnetic shield configuration can be seen. The further example differs from the embodiments shown with respect to FIG. 2 in that the metal plate 105 is in these embodiments a single plate. As there can be some difficulties in integrating two or three separate μ-metal parts in a real device the air gap 99 which forms the dust/magnetic trap 101 is formed by a cut-out in the μ-metal plate 105. In these embodiments the magnetic field around the dust trap although not as strong as could be generated from the two metal plate 105a, 105b configuration can be still strong enough to pull small metal particles to the metal plate air gap 99.

Furthermore as the dust/magnetic trap 101 is in such embodiments a cut-out in a single plate 105 the integration of the plate into the device, for example the assembly of the device is simpler and requires less severe manufacturing tolerances. In such embodiments the cut-out forming the magnetic trap 101 should be as narrow as possible.

Once again the cut out region can be any suitable cut our region or regions, and be any suitable shape or configuration.

Figure 4:
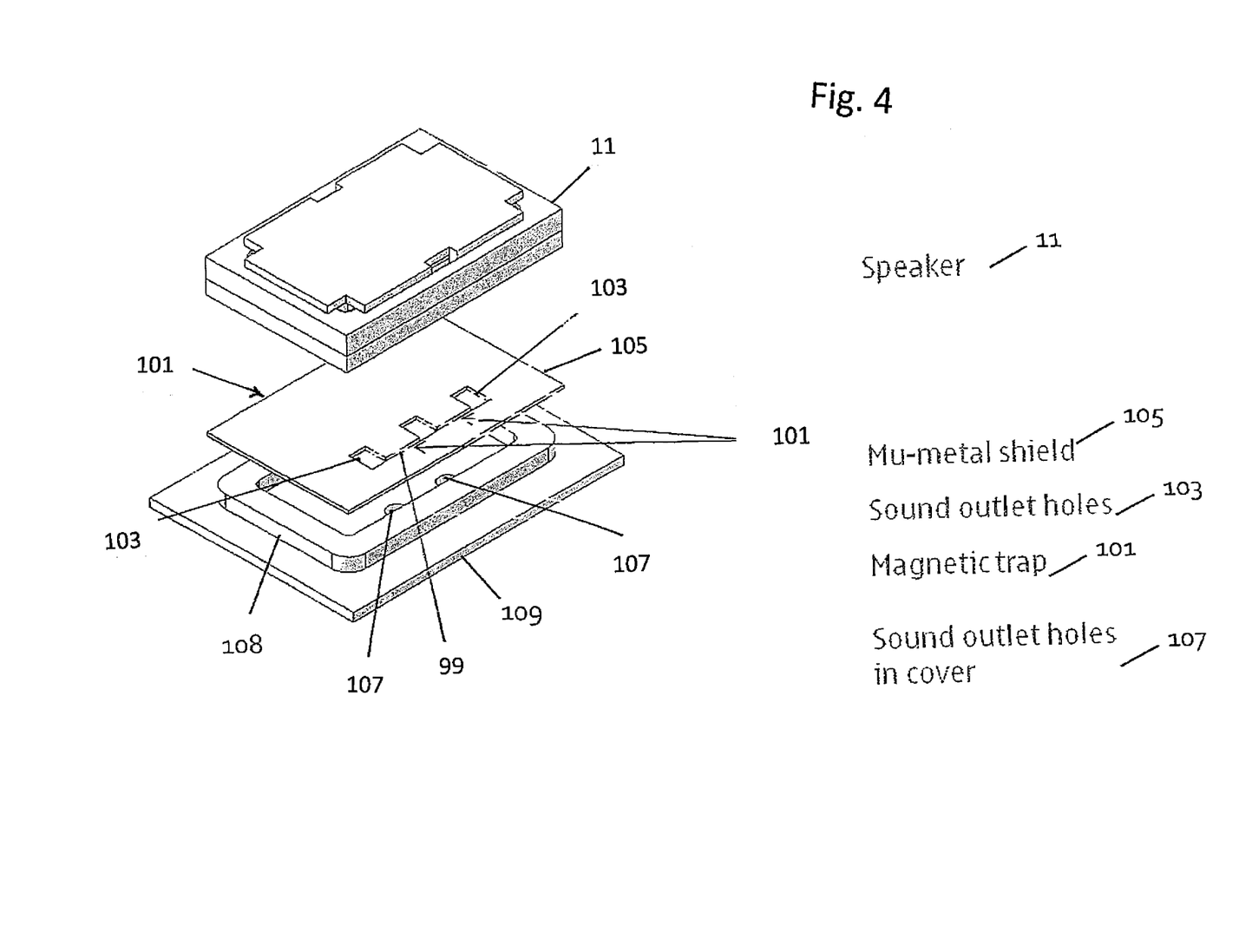
FIG. 4 illustrates a schematic diagram of a third magnetic shield configuration according to some embodiments of the application.

With respect to FIG. 4 a further example of a suitable magnetic shield configuration can be seen. As shown with respect to FIG. 3 the metal plate 105 can be formed from a single plate or laminar of μ-metal or equivalent electrodynamic properties material. However in some embodiments as shown in FIG. 4 at least one of the dust/magnetic traps 101 and sound outlets holes 103 are formed by a single air gap 99 form. In these embodiments the structure of the fabrication of the metal plate requires fewer operations and/or less manufacturing tolerance.

In some embodiments of the above the configuration of the cover sound outlet holes 107 are located so that dust can be captured by the dust/magnetic trap 101 in the plate 105, before it can pass through the plate sound outlets 103. This for example in some embodiments can be achieved by locating the cover sound outlets 107 close to (and above) the dust/magnetic 101 trap (or similarly locating the dust/magnetic 101 trap close to the cover sound outlets 107.

As described herein the protection of the transducer for all embodiments can further be improved by implementing a dust mesh over the cover outlet holes 107 and/or the plate sound outlet holes 103. However, the dust mesh is not shown for simplicity.

In such embodiments described herein a very thin device construction can be formed when compared to mechanical dust traps and implementation of additional magnets and furthermore the only additional parts required are a μ-metal (or equivalent material) plate are required. The embodiments of the application furthermore aim to achieve an improvement over conventional construction metal plates using a series of holes spread out over the area of the μ-metal plate, as the remaining stray magnetic field in front of the loudspeaker is concentrated elsewhere than the sound outlets in the μ-metal plate in some embodiments.

Figure 5:
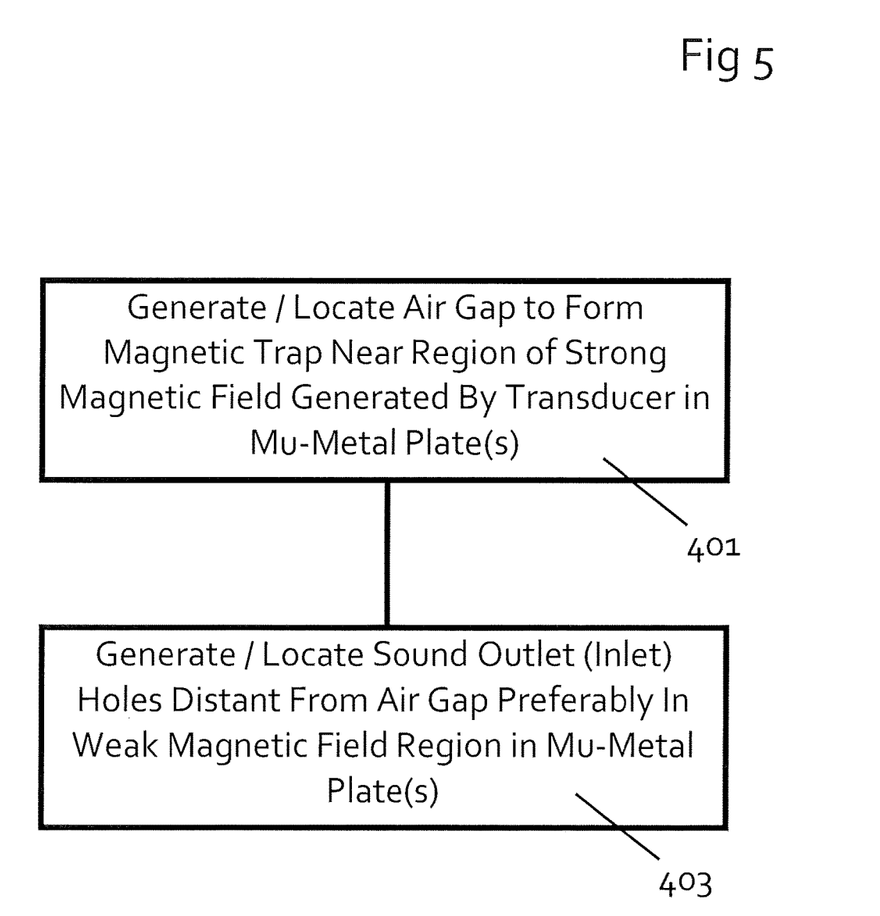
FIG. 5 illustrates a flow diagram of the method performed by the apparatus according to some embodiments.

With respect to FIG. 5 a flow chart of operations for generating a magnetic shield according to embodiments of the application is shown.

In some embodiments the first operation is to design/manufacture the air gap to form the dust/magnetic trap in the μ-metal or suitable material. In some embodiments such as shown in FIG. 2 the gap is formed by the close proximity of separate plates whereas as shown in FIGS. 3 and 4 the gap is formed by cutting or pressing material from a single plate to form a suitable air gap. The location of the air gap is configured to be in an area of relatively high magnetic field strength (such as generated by the transducer permanent magnet) so to form an magnetically attractive gap for the dust and other particles.

The operation of designing/manufacturing the air gap is shown in FIG. 5 by step 401.

Furthermore in some embodiments the further operation is to design/manufacture the sound transfer conduit for the μ-metal. These can in some embodiments be a sound outlet hole or holes or sound inlet hole or holes and be located in some embodiments away from the air gap (such as shown in FIGS. 2 and 3). In some embodiments the sound transfer conduits are configured to be in an area of weak magnetic field strength so to enable the transmission of sound but not attract the dust and other particles.

The operation of designing/manufacturing the sound transfer gap or conduit is shown in FIG. 5 by step 403.

It would be appreciated that in some embodiments, for example as shown in FIG. 4 the two operational steps with respect to the manufacturing operations can be carried out concurrently, where for example the same process for forming the air gap for the magnetic/dust trap and forming the sound transfer gaps are the same process. Furthermore as also shown in FIG. 4 the location of the sound transfer gap and the dust trap gaps can overlap.

In some embodiments there may a combination of one or more of the previously described embodiments.

It shall be appreciated that the term portable device is user equipment. The user equipment is intended to cover any suitable type of wireless user equipment, such as mobile telephones, portable data processing devices or portable web browsers. Furthermore, it will be understood that the term acoustic sound channels is intended to cover sound outlets, channels and cavities, and that such sound channels may be formed integrally with the transducer, or as part of the mechanical integration of the transducer with the device.

In general, the various embodiments may be implemented in hardware or special purpose circuits, software, logic or any combination thereof. Some aspects of the invention may be implemented in hardware, while other aspects may be implemented in firmware or software which may be executed by a controller, microprocessor or other computing device, although the invention is not limited thereto. While various aspects of the invention may be illustrated and described as block diagrams, flow charts, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

The embodiments of this invention may be implemented by computer software executable by a data processor of the mobile device, such as in the processor entity, or by hardware, or by a combination of software and hardware.

For example, in some embodiments the method of manufacturing the apparatus may be implemented with processor executing a computer program.

Further in this regard it should be noted that any blocks of the logic flow as in the Figures may represent program steps, or interconnected logic circuits, blocks and functions, or a combination of program steps and logic circuits, blocks and functions. The software may be stored on such physical media as memory chips, or memory blocks implemented within the processor, magnetic media such as hard disk or floppy disks, and optical media such as for example DVD and the data variants thereof, CD.

The memory may be of any type suitable to the local technical environment and may be implemented using any suitable data storage technology, such as semiconductor-based memory devices, magnetic memory devices and systems, optical memory devices and systems, fixed memory and removable memory. The data processors may be of any type suitable to the local technical environment, and may include one or more of general purpose computers, special purpose computers, microprocessors, digital signal processors (DSPs), application specific integrated circuits (ASIC), gate level circuits and processors based on multi-core processor architecture, as non-limiting examples.

Embodiments of the inventions may be practiced in various components such as integrated circuit modules. The design of integrated circuits is by and large a highly automated process. Complex and powerful software tools are available for converting a logic level design into a semiconductor circuit design ready to be etched and formed on a semiconductor substrate.

Programs, such as those provided by Synopsys, Inc. of Mountain View, Calif. and Cadence Design, of San Jose, Calif. automatically route conductors and locate components on a semiconductor chip using well established rules of design as well as libraries of pre-stored design modules. Once the design for a semiconductor circuit has been completed, the resultant design, in a standardized electronic format (e.g., Opus, GDSII, or the like) may be transmitted to a semiconductor fabrication facility or "fab" for fabrication.

As used in this application, the term 'circuitry' refers to all of the following:
(a) hardware-only circuit implementations (such as implementations in only analog and/or digital circuitry) and
(b) to combinations of circuits and software (and/or firmware), such as: (i) to a combination of processor(s) or (ii) to portions of processor(s)/software (including digital signal processor(s), software, and memory(ies) that work together to cause an apparatus, such as a mobile phone or server, to perform various functions and
(c) to circuits, such as a microprocessor(s) or a portion of a microprocessor(s), that require software or firmware for operation, even if the software or firmware is not physically present.

This definition of 'circuitry' applies to all uses of this term in this application, including any claims. As a further example, as used in this application, the term 'circuitry' would also cover an implementation of merely a processor (or multiple processors) or portion of a processor and its (or their) accompanying software and/or firmware. The term 'circuitry' would also cover, for example and if applicable to the particular claim element, a baseband integrated circuit or applications processor integrated circuit for a mobile phone or similar integrated circuit in server, a cellular network device, or other network device.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims. Indeed in there is a further embodiment comprising a combination of one or more of any of the other embodiments previously discussed.

The invention claimed is:

1. An apparatus for magnetic shielding for an audio transducer, the apparatus comprising:
at least one magnetic shielding plate located between the audio transducer, which comprises a magnet, and an exterior of the apparatus, at least one sound outlet hole at the exterior of the apparatus configured to permit sound to pass therethrough to and from the exterior of the apparatus, wherein the at least one magnetic shielding plate comprises a material with high magnetic permeability and at least one conduit configured to permit sound to pass therethrough, wherein the at least one magnetic shielding plate is configured to form a trap for metallic dust particles, and the trap for the metallic dust particles comprises at least one air gap configured to provide an area of a locally concentrated magnetic field region, wherein the locally concentrated magnetic field region is increased at the at least one air gap on the at least one magnetic shielding plate to attract the metallic dust particles such that the increased locally concentrated magnetic field region at the at least one air gap is greater than other areas of said at least one magnetic shielding plate, thereby substantially preventing the metallic dust particles from reaching the audio transducer.

2. The apparatus as claimed in claim 1, wherein the at least one magnetic shielding plate is configured to form part of an apparatus cover or is located between the audio transducer and an apparatus cover.

3. The apparatus as claimed in claim 1, wherein the at least one magnetic shielding plate comprises a first plate including the at least one conduit, wherein the trap for the metallic dust particles provides the locally concentrated magnetic field region configured to provide a magnetic field region of higher concentration in the first plate and the at least one conduit is located in a magnetic field region of lower concentration in the first plate.

4. The apparatus as claimed in claim 3, wherein the at least one magnetic shielding plate further comprises at least one second plate, the at least one second plate being located in close proximity to the first plate to form at least one narrow air gap between the first plate and the at least one second plate.

5. The apparatus as claimed in claim 3, wherein the at least one air gap is shaped to include an edge so as to provide the locally concentrated magnetic field region for trapping the metallic dust particles.

6. The apparatus as claimed in claim 1, wherein the audio transducer is configured to generate a region of locally stronger magnetic field, wherein at least one of the at least one air gap is configured to be located according to a region of locally stronger magnetic field generated by the audio transducer.

7. The apparatus as claimed in claim 1, wherein the trap for the metallic dust particles comprising the at least one air gap is coated by a material layer whose relative permeability is lower than the magnetic shielding plate.

8. The apparatus as claimed in claim 1, wherein the audio transducer is configured to generate a region of locally weaker magnetic field, wherein the at least one conduit configured to permit sound to pass through the magnetic shielding plate is configured to be located according to a region of locally weaker magnetic field generated by the audio transducer.

9. The apparatus as claimed in claim 1, wherein the at least one magnetic shielding plate comprises at least one of:
a mu-metal;
a material with high magnetic permeability;
stainless steel grade SUS 310; and
stainless steel grade SUS 430.

10. The apparatus as claimed in claim 1, wherein the audio transducer is configured to generate a region of locally stronger magnetic field and a region of locally weaker magnetic field, wherein at least one of the at least one air gap is configured to be located in the region of locally stronger magnetic field generated by the audio transducer, and wherein the at least one conduit configured to permit sound to pass therethrough is configured to be located according to a region of locally weaker magnetic field generated by the audio transducer.

11. The apparatus as claimed in claim 1, wherein the locally concentrated magnetic field region is greater than an attractive force of the magnet of the audio transducer through the at least one sound outlet hole.

12. A method for magnetic shielding for an audio transducer, the method comprising:
locating at least one magnetic shielding plate between the audio transducer, which comprises a magnet, and an exterior of an apparatus, and further locating at least one sound outlet hole at the exterior of the apparatus configured to permit sound to pass therethrough to and from the exterior of the apparatus, wherein the at least one magnetic shielding plate comprises a material with high magnetic permeability and at least one conduit configured to permit sound to pass therethrough; and
forming a trap for metallic dust particles in the at least one magnetic shielding plate wherein the trap for the metallic dust particles comprises at least one air gap configured to provide an area of a locally concentrated magnetic field region, wherein the locally concentrated magnetic field region is increased at the at least one air gap on the at least one magnetic shielding plate to attract the metallic dust particles such that the increased locally concentrated magnetic field region at the at least one air gap is greater than other areas of said at least one magnetic shielding plate, thereby substantially preventing the metallic dust particles from reaching the audio transducer.

13. The method as claimed in claim 12, wherein locating the at least one magnetic shielding plate comprises locating the magnetic shielding plate between the audio transducer and an apparatus cover or forming the magnetic shielding plate as part of an apparatus cover.

14. The method as claimed in claim 12, wherein the at least one magnetic shielding plate comprises a first plate, wherein the first plate comprises the at least one conduit configured to permit sound to pass, and further comprising locating the trap for the metallic dust particles to provide the locally concentrated magnetic field region configured to provide a magnetic field region of higher concentration generated by the audio transducer and locating the at least one conduit in a magnetic field region of lower concentration generated by the audio transducer.

15. The method as claimed in claim 14, wherein the at least one magnetic shielding plate further comprises at least one second plate, the at least one second plate being located in close proximity to the first plate to form at least one narrow air gap between the first plate and the at least one second plate to form the trap for the metallic dust particles.

16. The method as claimed in claim 14, further comprising:
generating by the audio transducer a region of locally weaker magnetic field; and
locating the at least one conduit configured to permit sound to pass through the magnetic shielding plate according to a region of locally weaker magnetic field generated by the audio transducer.

17. The method as claimed in claim 12, further comprising:
generating by the audio transducer a region of locally stronger magnetic field; and
locating the at least one air gap according to a region of locally stronger magnetic field generated by the audio transducer.

18. The method as claimed in claim 12, further comprising coating the trap for the metallic dust particles comprising the at least one air gap with a material layer whose relative permeability is lower than the magnetic shielding plate.

19. The method as claimed in claim 12, wherein the at least one air gap includes an edge so as to provide the locally concentrated magnetic field region for trapping the metallic dust particles.

* * * * *